(12) United States Patent
DeHaven

(10) Patent No.: US 6,676,991 B2
(45) Date of Patent: Jan. 13, 2004

(54) ETCH RESIST USING PRINTER TECHNOLOGY

(75) Inventor: Maxwell S. DeHaven, Vancouver, WA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 127 days.

(21) Appl. No.: 10/040,086

(22) Filed: Oct. 29, 2001

(65) Prior Publication Data

US 2003/0079624 A1 May 1, 2003

(51) Int. Cl.$^7$ ................................................ B05D 5/12
(52) U.S. Cl. ..................... 427/96; 427/98; 427/282; 216/13; 216/41; 101/170; 101/483; 101/163
(58) Field of Search .................. 216/13, 41; 427/96, 427/98, 282; 101/170, 483, 163

(56) References Cited

U.S. PATENT DOCUMENTS

| | | | | |
|---|---|---|---|---|
| 3,668,003 A | * | 6/1972 | Furness | 427/98 |
| 4,049,844 A | * | 9/1977 | Bolon et al. | 427/492 |
| 4,368,281 A | * | 1/1983 | Brummett et al. | 523/458 |
| 4,991,287 A | * | 2/1991 | Piatt et al. | 29/840 |
| 5,061,551 A | * | 10/1991 | Durand | 428/209 |
| 5,148,355 A | * | 9/1992 | Lowe et al. | 361/778 |
| 5,450,286 A | * | 9/1995 | Jacques et al. | 361/749 |
| 5,759,269 A | * | 6/1998 | Cutting et al. | 118/213 |
| 5,826,329 A | * | 10/1998 | Roth | 29/846 |
| 6,109,175 A | * | 8/2000 | Kinoshita | 101/170 |
| 6,405,647 B2 | * | 6/2002 | Kinoshita | 101/163 |

* cited by examiner

Primary Examiner—Andrew H. Hirshfeld
Assistant Examiner—Andrea H. Evans

(57) ABSTRACT

The present invention provides a printer and an inexpensive method for producing a printed circuit board using a printer configured to facilitate printing at least directly on a copper-clad substrate. The method includes the steps of feeding a copper-clad substrate into the printer, printing an inverse circuit image on the copper-clad substrate, allowing the inverse circuit image to dry, metalizing the copper-clad substrate to adhere a resist mask to exposed, uninked copper to form a metalized circuit image, and etching the copper-clad substrate that has been metalized to remove copper that forms the inverse circuit image.

13 Claims, 4 Drawing Sheets

ETCH RESIST USING PRINTER TECHNOLOGY

BACKGROUND OF THE INVENTION

The present invention relates to printer capabilities, and more particularly to printers capable of "printing" etch resist directly to a metal to facilitate fabrication of printed circuit boards.

There are a number of methods for creating a printed circuit. In early fabrications of semiconductors, a photographic process was used to create a fine pattern of an integrated circuit, wherein each layer of the chip was defined by a specific mask. Typically, there could be 16–24 mask layers for each integrated circuit. Masks were typically stored in a chip design database. In one embodiment, each mask was made by placing a film of chromium in a pattern on a pure quartz glass plate. The finished plates were manufactured by very sophisticated pattern generating equipment. Patterns were formed by using a laser or electron-beam driven devices to remove chromium from the chromium-plated quartz so that only the desired pattern of chromium was left behind. This method was expensive.

In another type of fabrication, a photoresist has been used. A substrate is coated with copper, then coated with a layer of photoresist. A photoresist is a light-sensitive material that, on exposure to ultraviolet light, undergoes a chemical reaction much like the action of light on photographic film. When the photoresist is developed, a negative image of the mask is created. A chemical etchant may be applied to etch away the material that is not protected by the photoresist. Two types of photoresists may be used. If the photoresist hardens on exposure to light, when the excess resist is removed, a negative copy of the mask, commonly called a negative photoresist, is left behind.

Alternatively, a positive photoresist may be designed to degrade upon exposure to light. When developed, the photoresist is deposited in the areas where the light did not expose the resist, providing a positive copy of the mask. A liquid developer may be used to form a relief image, and a chemical etchant may be used to remove unwanted copper. The copper protected by the photoresist mask forms the desired circuit pattern. The photoresist is then peeled off, exposing the desired circuit pattern of copper.

Traditionally, in a small business environment, a library of masks is stored in memory of a computer, and a laser printer using toner may be used to print a mask of a desired circuit on a transparency. Generally, a substrate is coated with photo-sensitive copper. Alternatively, boards that have been coated with photo-sensitive copper may also be available from the marketplace. The transparency is placed over the photo-sensitive copper, and the inverse image of the circuit is burned into the resist for a time that typically has been determined by running a series of time-exposure tests on a sample of the photo-sensitive copper. The photo-sensitive copper that has the desired circuit burned into it is developed and etched. The etchant dissolves the unprotected copper off the board, leaving the desired circuit. This process is time-consuming, difficult, and costly. However, this method also has problems associated with it. The photo-resist typically has a limited shelf-life, and the necessary exposure time may vary depending on conditions. The process requires a dark room, two chemical baths, and expensive photo-sensitive copper.

Thus, there is a need for a less expensive, less complex process for preparing a printed circuit board.

SUMMARY OF THE INVENTION

The present invention provides a printer and an inexpensive method for producing a printed circuit board using a printer configured to facilitate printing at least directly on a copper-clad substrate. The method includes the steps of feeding a copper-clad substrate into the printer, printing an inverse circuit image on the copper-clad substrate, allowing the inverse circuit image to dry, metalizing the copper-clad substrate to adhere a resist mask to exposed, uninked copper to form a metalized circuit image, and etching the copper-clad substrate that has been metalized to remove copper that forms the inverse circuit image.

DETAILED DESCRIPTION OF THE PREFERRED EMBODIMENT

The present invention provides a method and printer for inexpensively producing printed circuit boards by printing an inverse circuit image directly on a copper-clad substrate, metalizing the exposed, uninked copper surface and etching away copper that forms the inverse circuit image. In the present invention, the use of expensive photo-sensitive copper is not required, saving in the expense of materials needed to produce the circuit board. For optimal results, the copper-clad substrate should be thoroughly cleaned before printing onto it.

Chemical etchant solutions may include cupric chloride, ferric chloride, sodium peroxydisulfate, ammonium persulfate, ammoniacal cupric chloride, hydrochloric acid and nitric acid. In general, all stripping solutions are operative in the practice of this invention so long as they do not cause excessive attack of the tinned or metalized copper layer of the substrate. For example, the etchant may be sprayed onto the surface. Where desired, etching may be accomplished at temperatures of 110 degrees Fahrenheit for a period of time determined by trial and error to be suitable for the particular implementation. For a discussion of typically useful etchants and process conditions, see U.S. Pat. No. 5,509,557, which is incorporated herein by reference in its entirety.

Figure 1:
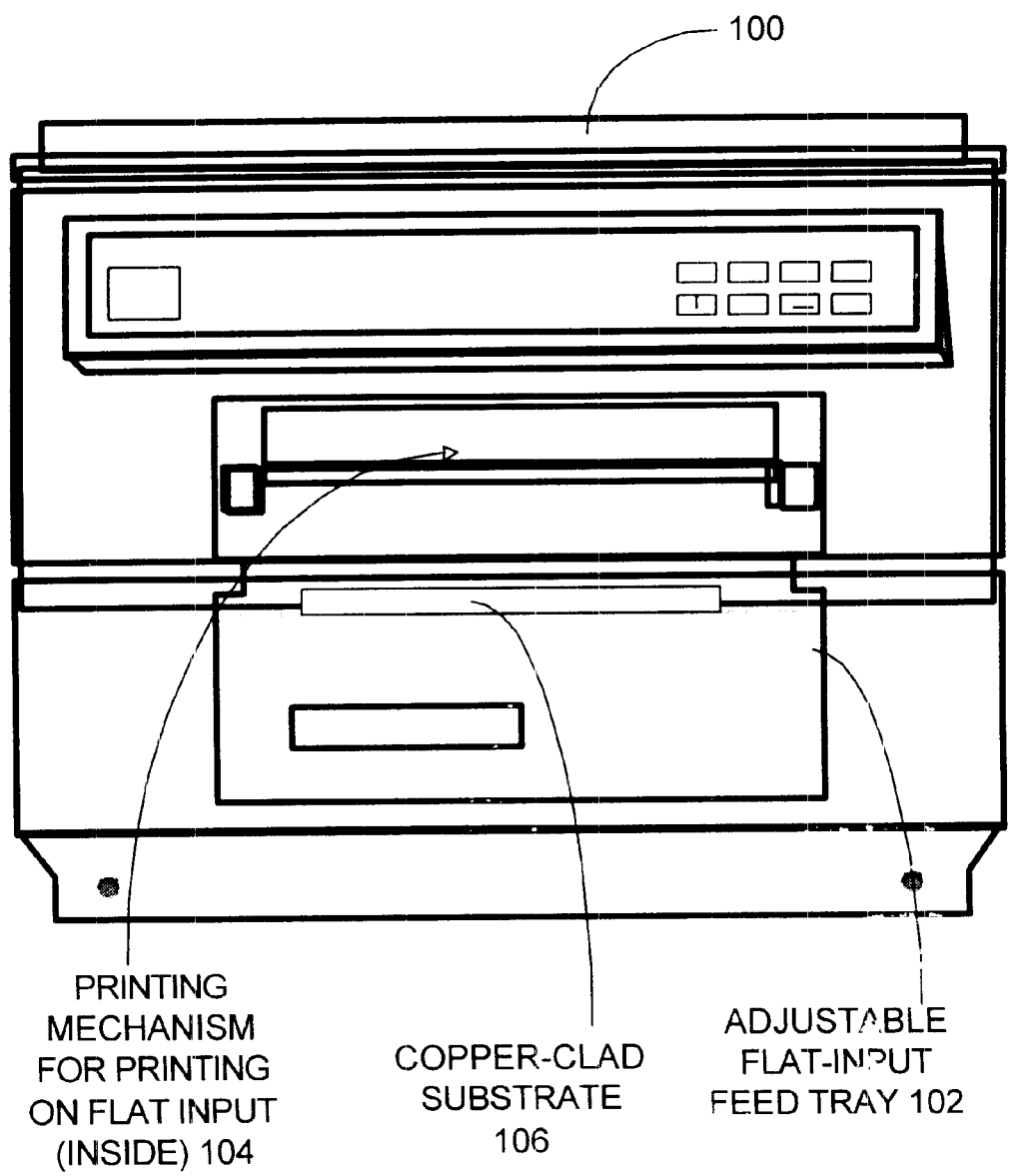
FIG. 1 is one embodiment of a representation of a printer that is configured to print flat input substrates in accordance with the present invention.
Figure 4:
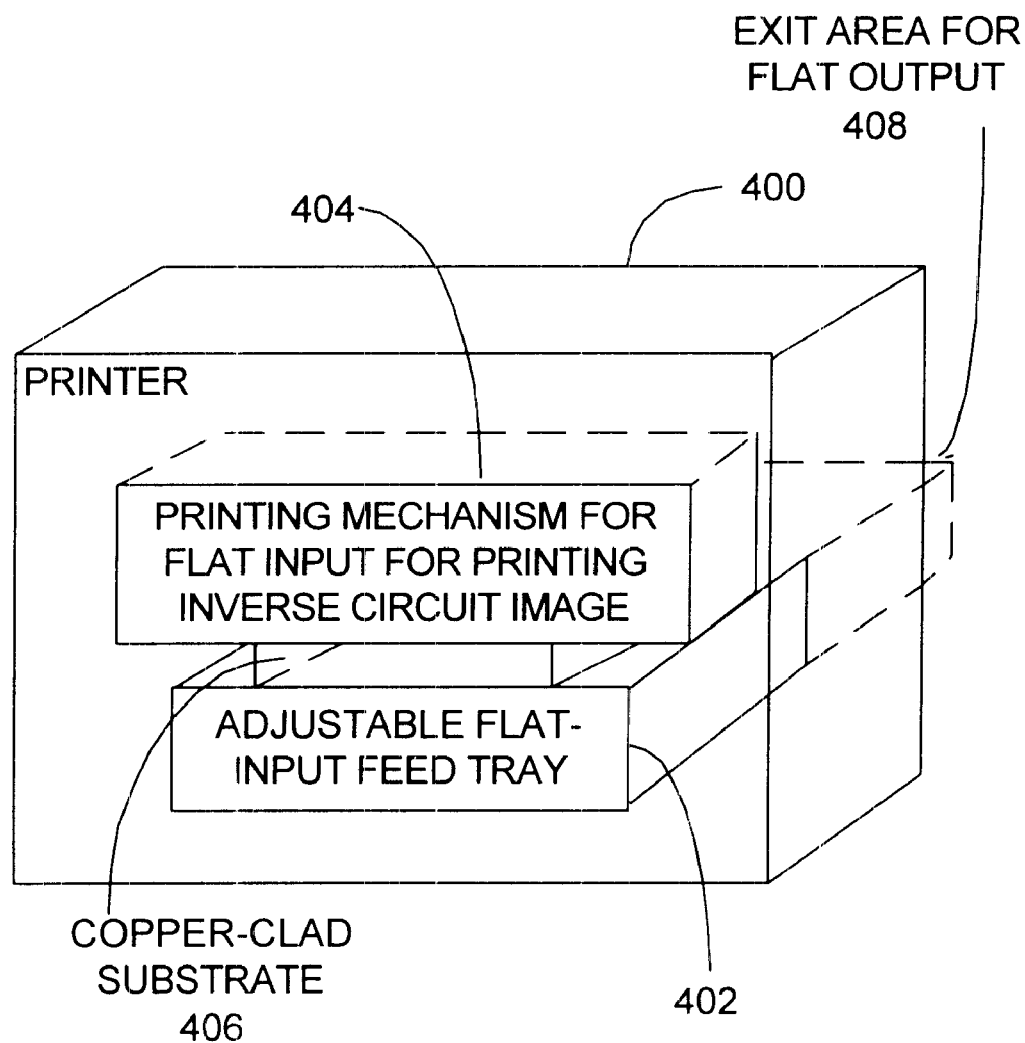
FIG. 4 is a block diagram of one embodiment of a printer in accordance with the present invention.

The printer 100, 400 is arranged to accommodate a flat input of at least one substrate suitable for fabrication of a printed circuit board. That is, as shown in FIG. 1 and FIG. 4, paper may be fed into the printer 100, 400 and exit the opposite side 408. In addition, a copper-clad substrate 106, 406 may be fed through the printer and exit the opposite side 408. The width of the flat-input feed tray 102, 402 for the substrate may be adjusted, for example, in the fashion that printers use to accommodate odd width paper inputs such as envelopes and postcards. The flat input feed tray 102, 402 may have a pressure feed that is adjustable (not shown) so that various thicknesses of substrates may be accommodated. Alternatively, the flat-input feed tray 102, 402 may simply be adjustable to various fixed settings that accommodate a plurality of desired substrate thicknesses. Since various types of pressure feeds and fixed setting feeds are known in the art, such arrangements will not be further described here. Generally, the copper-clad substrate is cleaned prior to printing the inverse circuit image thereon to facilitate better adhesion of the printer ink to the copper surface. Any selected suitable ink may be utilized. For example, India ink may be used to print the inverse circuit image. Cleaning may be accomplished by immersing the copper-clad substrate briefly in a suitable chemical bath, polishing, or the like. As is known in the art, he printer 100, 400 may be coupled to a computing device (not shown) or may include a control panel for printing control.

Figure 2:
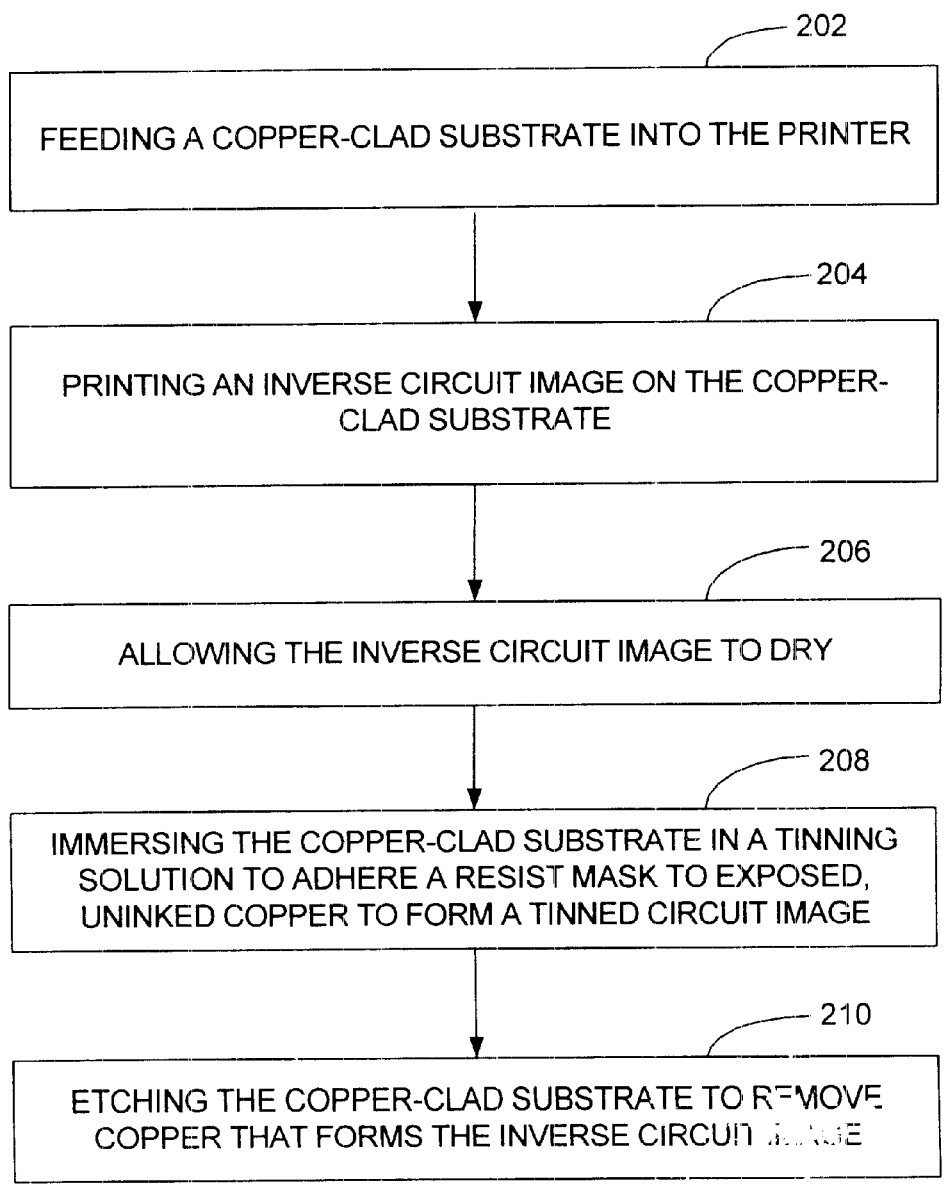
FIG. 2 is a flow chart showing one embodiment of steps of a method in accordance with the present invention.

FIG. 2 shows one embodiment of steps for an inexpensive method for producing a printed circuit board using a printer configured to print at least directly on a copper-clad substrate in accordance with the present invention. The steps include feeding 202 a copper-clad substrate into the printer and then printing 204 an inverse circuit image on the copper-clad substrate. The inverse circuit image is allowed 206 to dry. Then, the copper-clad substrate may be immersed 208 in a tinning solution to adhere a resist mask to exposed, uninked copper so that a tinned circuit image is formed. The copper-clad substrate is then etched to remove the copper that forms the inverse circuit image. Where desired, the printer may utilize water-insoluble ink.

Where desired, the input path for the printer may be adjustable to include at least two settings: a first setting to feed paper through a printing process and a second setting to accommodate a copper-clad substrate having a predetermined size. The width of the copper-clad substrate may be accommodated by utilizing moveable sides for the input tray as is known in the art for, for example, feeding envelopes or postcards into a printer. In addition, the setting for the input path for the printer to accommodate the copper-clad substrate may be further adjustable to accommodate a plurality of thicknesses of copper-clad substrates. Any suitable printer ink, such as for example, India ink, may be utilized.

Figure 3:
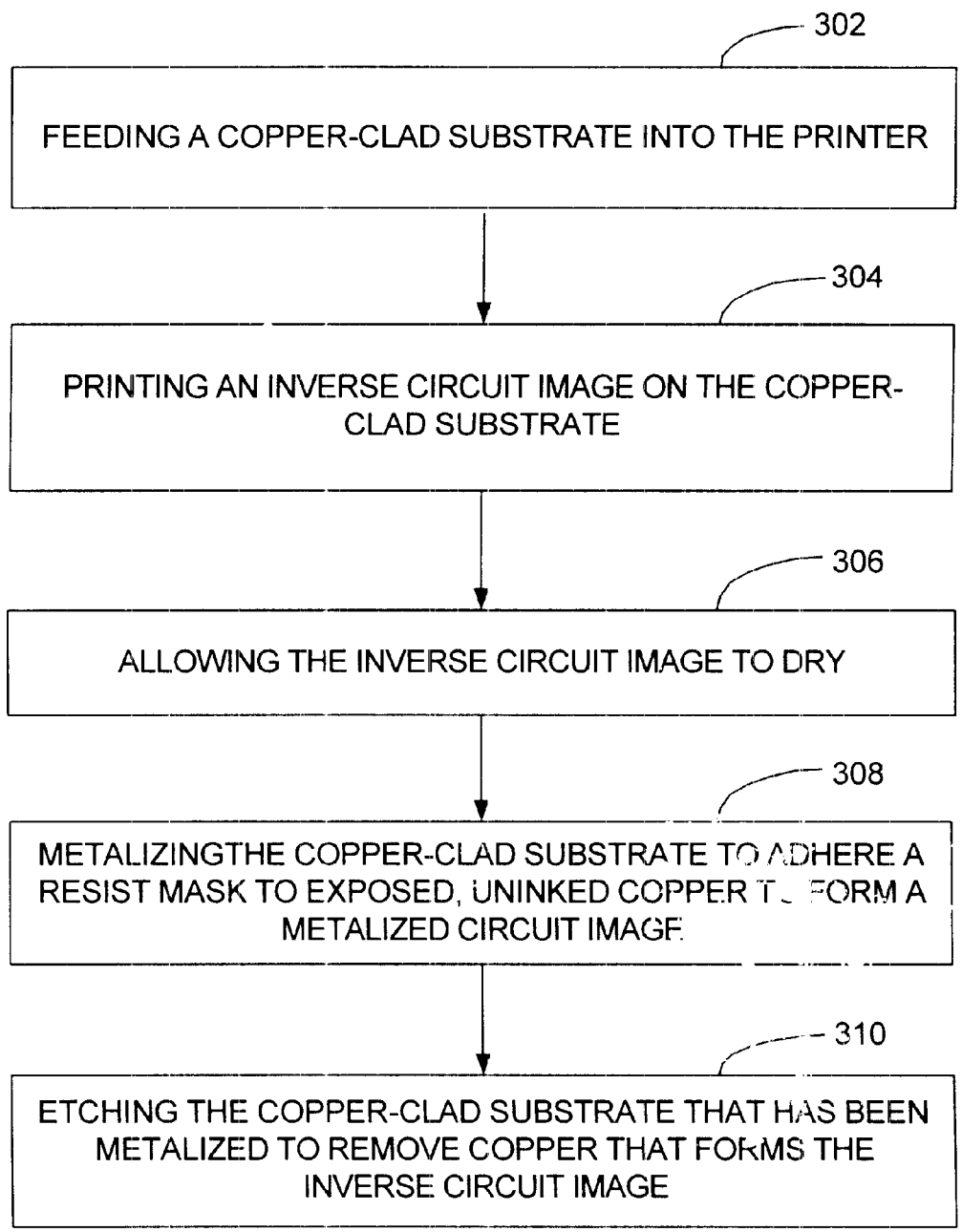
FIG. 3 is a flow chart showing another embodiment of steps of a method in accordance with the present invention.

FIG. 3 is a flow chart showing steps of another inexpensive method for producing a printed circuit board using a printer configured to facilitate printing at least directly on a copper-clad substrate in accordance with the present invention. The steps include feeding 302 a copper-clad substrate into the printer, printing 304 an inverse circuit image on the copper-clad substrate, allowing 306 the inverse circuit image to dry, metalizing 308 the copper-clad substrate to adhere a resist mask to exposed, uninked copper to form a metalized circuit image, and etching 310 the copper-clad substrate that has been metalized to remove the copper that forms the inverse circuit image. In a preferred embodiment, water-insoluble ink may be utilized. The input path for the printer may be adjustable to include at least a first setting to feed paper through a printing process and a second setting to accommodate a copper-clad substrate having a predetermined size. The settings for the input path for the printer may further include settings to accommodate a plurality of sizes of copper-clad substrates. Thus, as described above, copper-clad substrates of various widths and thicknesses may be used. Typically, a library of inverse circuit images is stored on a computing device and is used to direct the printing process.

Metalizing the copper-clad substrate to adhere a resist mask to exposed, uninked copper generally includes coating the exposed, uninked copper with another suitable metal such as manganese, chromium, aluminum, iron, cobalt, nickel, tin, zinc, cadmium, palladium, or lead. Also, alloys of the recited metals may be used. The metalization process may be accomplished by a number of methods, as is known in the art. For example, metalization may be accomplished by soldering, electro-plating or electroless plating.

FIG. 4 is a block diagram of a printer 400 configured to print at least directly on a copper-clad substrate to facilitate inexpensively producing a printed circuit board. The printer includes an adjustable flat-input feed tray 402 for feeding at least a copper-clad substrate 406 into the printer and a printing mechanism 404, proximate to the adjustable feeding mechanism 402, arranged to provide for printing an inverse circuit image on the copper-clad substrate 406 wherein, after the image is printed, the inverse circuit image is allowed to dry, the copper-clad substrate 406 is immersed in a tinning solution to adhere a resist mask to exposed, uninked copper to form a tinned circuit image, and the copper-clad substrate 406 is etched to remove the copper that forms the inverse circuit image. Thus, a tinned copper circuit image remains, providing a facilitated electrical connection. Alternatively, after the inverse circuit image is allowed to dry, the copper-clad substrate 406 may be metalized to adhere a resist mask to exposed, uninked copper to form a metalized circuit image, and the copper-clad substrate that has been metalized is etched to remove copper that forms the inverse circuit image. Typically, water-insoluble ink may be used. The adjustable feeding flat-input feed tray 402 typically includes at least two settings: a first setting to feed paper through a printing process and a second setting to accommodate a copper-clad substrate having a predetermined size. Also, an ink source for the printer may be removable, so that, where desired, different inks may be used to print on paper or copper-clad substrates. Where desired, where a plurality of input sizes are desired, the input settings may include a plurality of fixed settings, or alternatively, may utilize a pressure-controlled input arranged to accommodate a plurality of sizes of copper-clad substrates. Again, the user may utilized any desired suitable ink, such as, for example, India ink. After drying, the printed inverse circuit diagram exposes the uninked copper, which may be metalized to adhere a resist mask using at least one of: manganese, chromium, aluminum, iron, cobalt, nickel, tin, zinc, cadmium, palladium and lead or an alloy thereof. Metalization may be accomplished via soldering, electro-plating, electroless plating or any other suitable technique.

Thus, methods and printers have been described according to the present invention. Many modifications and variations may be made to the techniques and structures described and illustrated herein without departing from the spirit and scope of the invention. Accordingly, it should be understood that the methods and printers described herein are illustrative only and are not limiting upon the scope of the invention.

What is claimed is:

1. An inexpensive method for producing a printed circuit board using a printer configured to facilitate printing at least directly on a copper-clad substrate, comprising the steps of:
   feeding a copper-clad substrate into the printer;
   printing an inverse circuit image on the copper-clad substrate;
   allowing the inverse circuit image to dry;
   immersing the copper-clad substrate in a tinning solution to adhere a resist mask to exposed, uninked copper to form a tinned circuit image; and
   etching the copper-clad substrate to remove copper forming the inverse circuit image.

2. The method of claim 1 wherein the printer utilizes water-insoluble ink.

3. The method of claim 1 wherein the printer utilizes India ink.

4. The method of claim 1 wherein an input path for the printer is adjustable to include at least two settings: a first setting to feed paper through a printing process and a second setting to accommodate a copper-clad substrate having a predetermined size.

5. The method of claim 4 wherein the second setting for the input path for the printer to accommodate a copper-clad substrate is further adjustable to accommodate a plurality of sizes of copper-clad substrates.

6. An inexpensive method for producing a printed circuit board using a printer configured to facilitate printing at least directly on a copper-clad substrate, comprising the steps of:

feeding a copper-clad substrate into the printer;

printing an inverse circuit image on the copper-clad substrate;

allowing the inverse circuit image to dry;

metalizing the copper-clad substrate to adhere a resist mask to exposed, uninked copper to form a metalized circuit image; and etching the copper-clad substrate that has been metalized to remove copper that forms the inverse circuit image.

7. The method of claim 6 wherein the printer utilizes water-insoluble ink.

8. The method of claim 6 wherein the printer utilizes India ink.

9. The method of claim 6 wherein an input path for the printer is adjustable to include at least two settings: a first setting to feed paper through a printing process and a second setting to accommodate a copper-clad substrate having a predetermined size.

10. The method of claim 9 wherein the at least two settings for the input path for the printer include settings to accommodate a plurality of sizes of copper-clad substrates.

11. The method of claim 6 wherein the step of metalizing the copper-clad substrate to adhere a resist mask to exposed, uninked copper includes coating the exposed, uninked copper with at least one of: manganese, chromium, aluminum, iron, cobalt, nickel, tin, zinc, cadmium, palladium, and lead.

12. The method of claim 6 wherein the step of metalizing the copper-clad substrate to adhere a resist mask to exposed, uninked copper includes coating the exposed, uninked copper with an alloy of at least one of: manganese, chromium, aluminum, iron, cobalt, tin, zinc, nickel, cadmium, palladium, and lead.

13. The method of claim 6 wherein the step of metalizing the copper-clad substrate to adhere a resist mask to exposed, uninked copper includes coating the exposed, uninked copper by one of: soldering, electro-plating and electroless plating.

* * * * *